United States Patent [19]
Kowalski et al.

[11] Patent Number: 5,022,001
[45] Date of Patent: Jun. 4, 1991

[54] METHOD FOR THE PROGRAMMING OF THE MEMORY CELLS OF A MEMORY AND A CIRCUIT TO IMPLEMENT THIS METHOD

[75] Inventors: Jacek Kowalski, Trets, France; Christophe Chevalier, Santa Clara, Calif.

[73] Assignee: SGS-Thomson Microelectronics S.A., Gentilly, France

[21] Appl. No.: 258,801

[22] Filed: Oct. 17, 1988

[30] Foreign Application Priority Data

Oct. 19, 1987 [FR] France .................. 87 14343

[51] Int. Cl.$^5$ .................................. G11C 17/00
[52] U.S. Cl. ........................... 365/185; 365/203; 365/218
[58] Field of Search ............. 365/185, 203, 218

[56] References Cited

U.S. PATENT DOCUMENTS 4,377,857 3/1983 Tickle .................. 365/185
4,601,020 7/1986 Arakawa et al. ........... 365/185 X

FOREIGN PATENT DOCUMENTS 0104657 4/1984 European Pat. Off. .
0114504 8/1984 European Pat. Off. .
0154379 9/1985 European Pat. Off. .

Primary Examiner—Joseph A. Popek
Attorney, Agent, or Firm—Roland Plottel

[57] ABSTRACT

The use of charge pumps to supply bit lines, when programming memory cells connected to a bit line, is avoided by pre-charging this bit line simultaneously with the neutralization of the selection of this bit line. Subsequently, the pre-charging potential is uncoupled and the effects of the neutralization are stopped. It is known that this method of action prevents the breakdown of a single programming potential generator, used to supply all the bit lines. This results in a gain in space in the lay-out of the control circuits of the memory cells in the memory plane. This method can be implemented especially in page mode programming for memories where the memory cells have EEPROM-type floating-gate transistors.

8 Claims, 3 Drawing Sheets

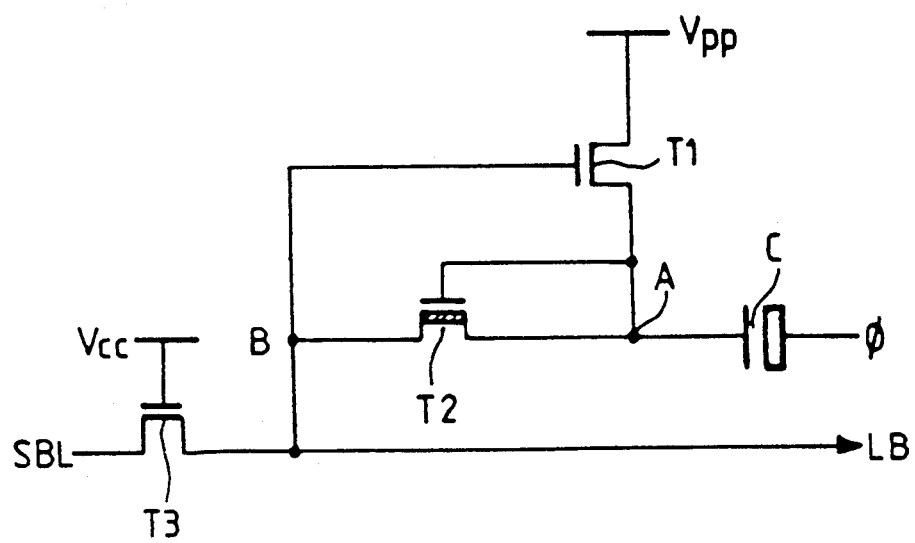
FIG_1
PRIOR ART

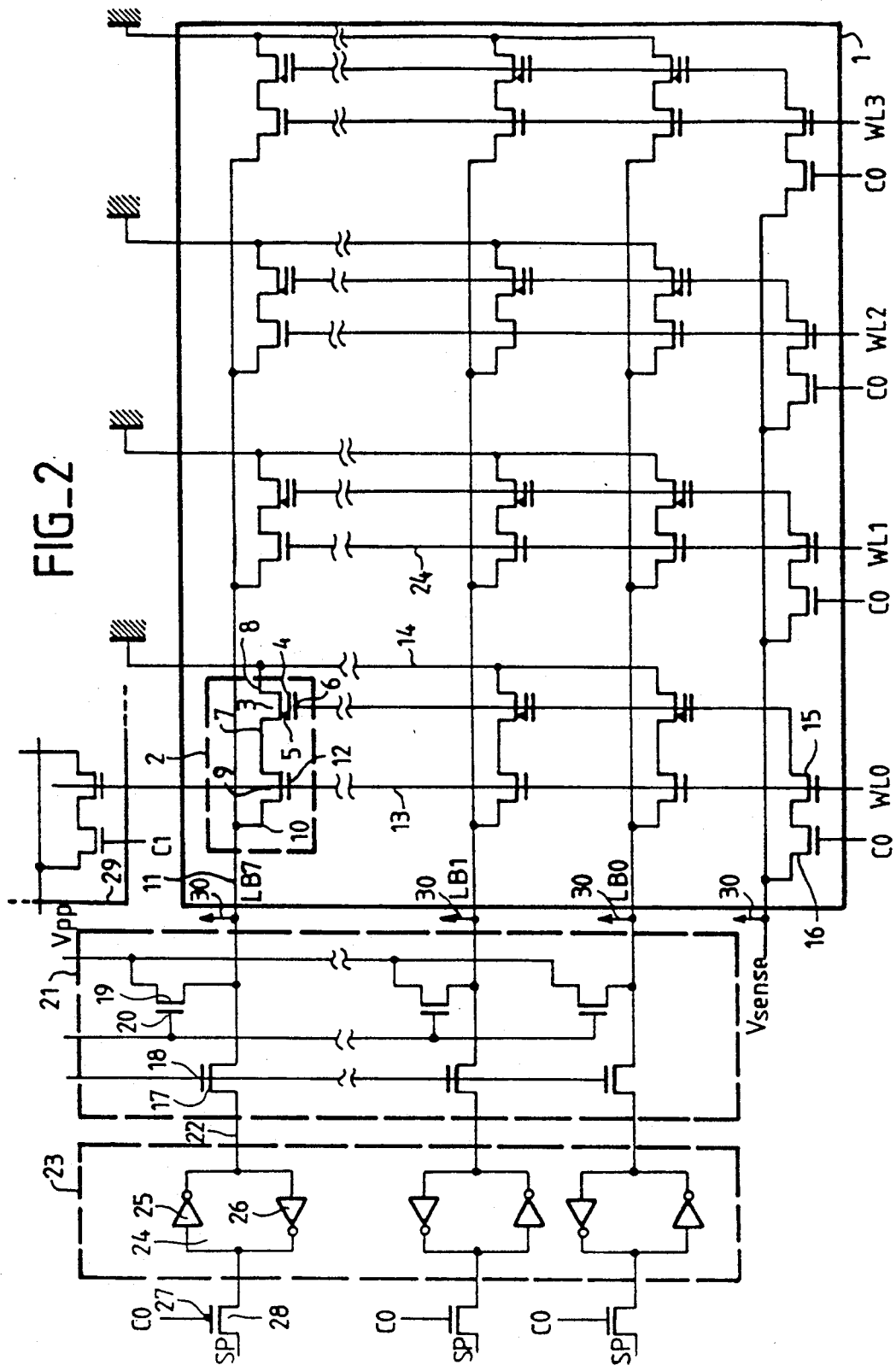

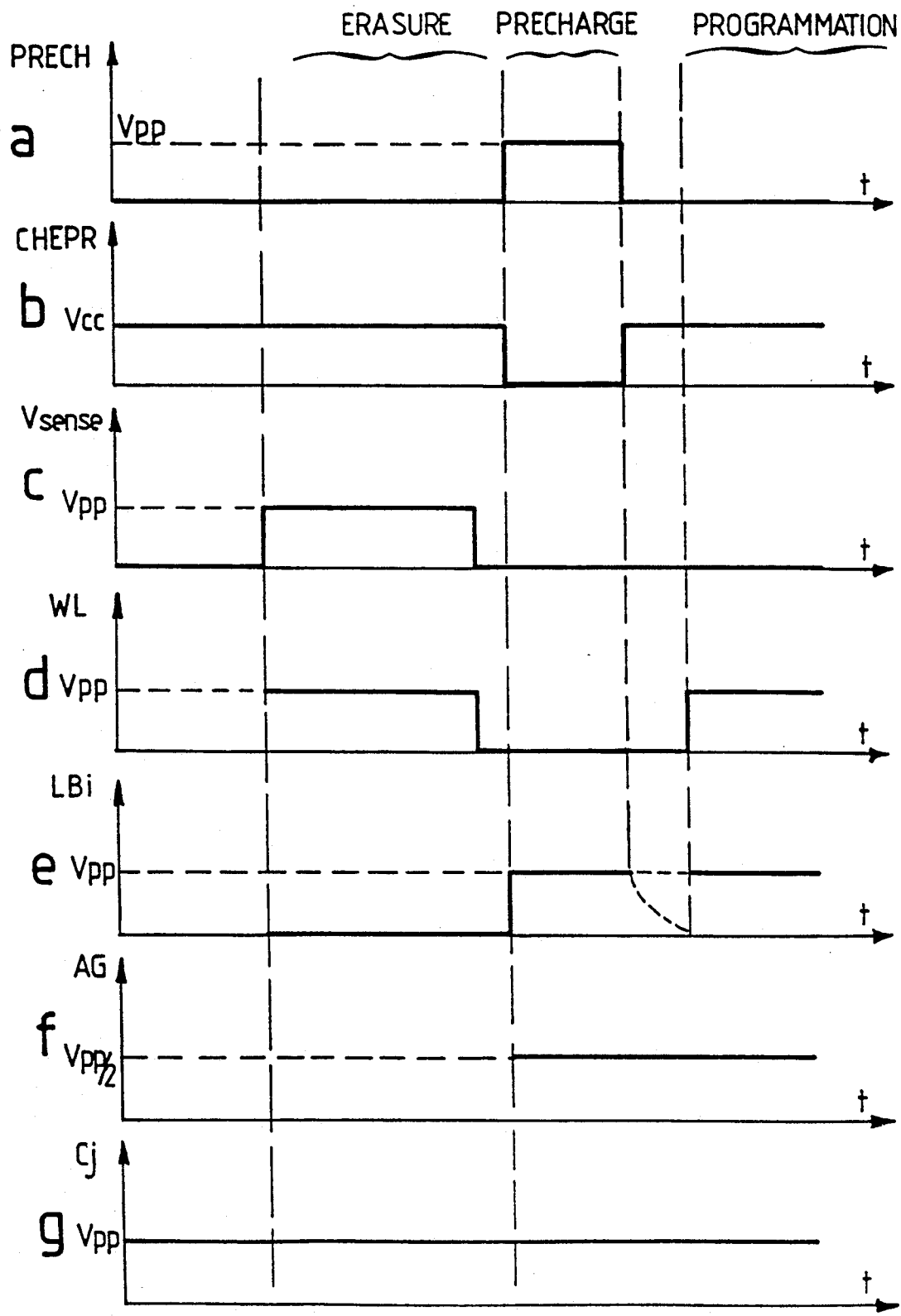

METHOD FOR THE PROGRAMMING OF THE MEMORY CELLS OF A MEMORY AND A CIRCUIT TO IMPLEMENT THIS METHOD

BACKGROUND OF THE INVENTION

1. Field of the Invention

An object of the present invention is a method to program the memory cells of a memory as well as a circuit to implement this method. It particularly concerns memories for which the memory cells comprise floating-gate transistors and for which the programming is got by an electrical field effect. More particularly, these memories are EEPROM memories, as distinct from EPROM memories for which the programming of the memory cells requires a saturation of the conduction channel of the floating-gate transistor acting as the memorizing element of these memory cells. In a special application, the programming method is more particularly used in "page mode". In this type of mode, several memory cells, connected to one and the same word line of the memory plane, are programmed at the same time. Furthermore, the invention is more particularly designed for programming operations in which high voltages are brought into play.

2. Description of the Prior Art

In the prior art, the programming of the floating-gate transistor of an EEPROM type memory cell is got by subjecting the drain and source regions of this transistor to a high potential as compared with a potential to which is subjected the control gate of this transistor, superimposed on the floating gate. For this programming purpose, the floating gate has a starting up boss used locally, at the boss itself, to increase the value of the electrical field induced by this difference in potential. Under the effect of this progamming electrical field, particles, namely electrons, leave the floating gate. Subsequently, when the transistor of this memory cell is subjected to normal action, in being powered or controlled, it stays on or goes off depending on whether or not it has been programmed by the migrations of electrons. Hence, for a transistor to be programmed, one of its regions (and necessarily the region close to the starting up boss) must be subjected to a high voltage VPP. This programming is erased by applying the high voltage VPP to the control gate and the low voltage to one of the regions (on the drain).

In practice, if the supply voltage of an integrated circuit of the EEPROM type is about 5 volts, VPP is about 20 volts. These EEPROM type circuits, especially in applications with memory cards using integrated circuits, are generally provided with internal generators for setting up the potential VPP. These generators, may, for example, comprise generators of the SHENKEL type. At high voltages, generators of this type cannot withstand a static consumption level exceeding a few microamperes. To enable the programming operation, it is customary to assist these generators, at every point where they distribute their high potential, by means of charge pumps. As seen in FIG. 1, a charge pump essentially comprises a transistor T1 connected, firstly, to the potential VPP generator and, secondly, at the point A, to a capacitor C. A native transistor T2 (with a threshold voltage VT=0) is connected, firstly, to the terminal A and, secondly, by the terminal B to the control gate of the transistor T1. At the other terminal of the capacitor C, a pulse signal is introduced, varying at a high rate between VCC and 0. This signal is, for example, a 5 MHz clock signal. The control gate of the transistor T2 is connected to the point A. A third transistor T3, the control gate of which is connected to the potential VCC, receives, firstly, a signal SBL which, depending on its state, marks the intention to program a memory cell. Secondly, the transistor T3 is connected to the point B. The point B is further connected to a bit line LB which ends in the source regions of the floating-gate transistors of the memory cells to be programmed.

If a bit line is not to be selected, for example because none of the memory cells connected to it is to be programmed, the signal SBL is equal to zero. If the signal SBL equals zero, the transistor T3 is in short circuit, and the point B and the bit line are at null potential, while the charge pump formed by the capacitor C and the transistor T2 delivers unnecessarily. However, the transistor T1 is off. If, on the contrary, the bit line is selected, if SBL equals VCC, it will be shown that the potential available at the bit line rises to VPP. More precisely, it rises to VPP+VT, VT being the threshold voltage of the transistor T1. Let it be assumed, for example, that when the pulse signal PHI is at zero, A is substantially equal to VCC. Under these conditions, since the transistor T2 is a native transistor, B is also substantially equal to VCC. Consequently, the transistor T3 is off. When the signal PHI rises to VCC, the capacitor CC transmits a voltage step and the potential of A rises, for example, by two volts. Under these conditions, the transistor T2 comes on and the potential at B follows the potential at A. When the signal PHI returns to zero, A undergoes a voltage drop which turns the transistor T2 off but turns the transistor T1 on. While the potential of B remains at the value which it has just reached and while the potential of A has decreased, the coming on of the transistor T1 forces the potential of A to rise. The potential of A increases substantially upto the value of the potential of B minus the drop in gate-source voltage in the transistor T1. For example, it can be assumed that A has thus gained one volt and has gone to 6 volts with respect to its previous situation. Continuing thus, at the rate of the pulses PHI, the potential of A and the potential of B rise to VPP (+VT). For, when the potential at B reaches VPP+VT, the node A, charged at each rising pulse of PHI, is discharged in the supply VPP by the transistor T1. When the potential of B has reached a sufficient level, the floating-gate transistor of the memory cell is programmed.

The drawback entailed by the existence of charge pumps is particularly felt when the memory is programmed in page mode, namely when it is sought to program all the bits belonging to one and the same word, i.e. all the bits belonging to different bit lines. The programming in page mode is valuable in itself because it enables access to several memory cells of the memory plane at the same time. For, in order to reduce the programming time related to one bit and inasmuch as the memory cells are distributed at the intersections of the bit lines and the word lines, it is preferable, rather than programming memory cells one after another, firstly, to select a set of bit lines and, secondly, to select a word line to program, at the same time, all the memory cells belonging to these bit lines and to this word line. It is then enough to change the word line to gain access to a new set of memory cells belonging to these bit lines and to this new word line.

In its principle, page mode programming makes it necessary for charge pumps to be assigned to each bit line of the memory plane. For, when the memory cells in a bit line have to be programmed, the concerned bit line is selected and its transistor T3 is off. By contrast, the memory cells which should not be programmed are placed on bit lines which, in correspondence, should not be selected: their transistor T3 should be on. If all the bit lines were to be connected to one and the same charge pump, it would delive to the non-selected bit lines transistors which are on, and none of the bit lines would have its potential rise to VPP. The complicated nature of the charge pumps and above all their bulk, namely the space that they occupy in a memory, are negative factors for the integration capacity of EEPROM type circuits.

An object of the invention is to overcome these drawbacks by eliminating the existence, at least to a great extent, of the charge pumps while, at the same time, enabling page mode programming operation in a preferred embodiment. In the invention, advantage is taken of the fact that the cells of an EEPROM type memory can be programmed without any consumption of current on the potential VPP because this programming is caused by an electrical field effect. In the method of the invention, before the programming, the selection of the bit lines is neutralized and, during this neutralizing process, all the bit lines are pre-charged at a high potential. Then the bit lines are selected by eliminating the neutralization. The potential of the non-selected bit lines naturally breaks down through their transistor T3 which is on. The potential of the selected bit lines does not break down because, with the pre-charging over, all the lines are then uncoupled from their VPP supply which may then break down. Finally, for the programming, a null potential is imposed on the control gates of the floating-gate transistors of the memory cells to be programmed. Under these conditions, only these transistors get programmed. It must be noted that these transistors were not programmed during the pre-charging process because, at that time, transistors providing access to the cells were off. They are turned off by a command applied to their control gate. In a preferred alternative, rather than selecting the control gates of the transistors of the memory cells to be programmed one after the other, a selection is made at the same time, and then a weak potential is imposed, at the same time, on all the control gates of the transistors connected to one and the same word line. Thus, the memory is programmed in page mode.

SUMMARY OF THE INVENTION

Consequently, an object of the invention is a method for programming the memory cells of a memory, said cells comprising floating-gate transistors programmable by electrical field effect, a method wherein:
the cells to be programmed are selected, and then the cells selected are programmed by the application of a programming potential,
wherein,
the selection of the cells is neutralized and these cells are pre-charged by applying certain programming potentials to them, then
the neutralization is stopped and
these cells are programmed by applying the other programming potentials to them.

The invention also concerns a circuit for the programming of floating-gate transistors of memory cells of a memory, comprising means to apply programming potentials to the terminals of these transistors, said circuit comprising a circuit for the pre-charging of at least one of these potentials on one of these terminals.

BRIEF DESCRIPTION OF THE DRAWINGS

The invention will be better understood from the following description and the accompanying figures, which are given purely by way of indication and in no way restrict the scope of the invention. Of these figures:

FIG. 1 shows a charge pump according the above-mentioned prior art;

FIG. 2 shows a schematic view of a circuit to implement the programming method according to the invention;

FIGS. 3a to 3b show timing diagrams of signals used in the method of the invention.

DESCRIPTION OF A PREFERRED EMBODIMENT

FIG. 2 shows a circuit to implement the method of the invention A memory 1 has memory cells such as 2 with a floating-gate transistor 3 as a memorizing element. This transistor 3 has a floating gate 4 provided with a starting up boss pin 5, a control gate 6 superimposed on the floating gate 4, a drain 7 and a source 8. The floating-gate transistor of each memory cell is series-connected, through its drain 7, with the source of an access transistor 9, the drain 10 of which is connected to a bit line 11 and the control gate 12 of which is connected to a word line 13. The source of the transistor 3 is connected to a so-called mains ground connection 14. The control gate 6 of the floating-gate transistor 3 is controlled by a signal VSENSE conveyed by a control monitoring transistor 15, series-connected with a driving transistor 16. The control monitoring transistor 15 receives, at its control gate, in common with all the control gates 12 of the access transistors 9 providing access to the transistors of the memory cells, a signal WLi for the selection of a word line transmitted by the word line: namely, a signal WLO for the word line 13. The driving transistor receives a driving control Cj When Cj and WLi are carried to a high potential, for example, VPP, the potential VSENSE is applied to all the control gates of the floating-gate transistors of the memory cells, controlled by one and the same word line and driving command selection signal.

In the invention, essentially, before the programming, the selection of bit lines, such as 11 ending in memory cells to be programmed, is neutralized by means of a neutralizing signal CHEPR. To this end, each bit line is in series with a switch, in practice a transistor such as the transistor 17 which receives the signal CHEPR at its control gate 18. This neutralization is complemented by a non-selection of all the word lines: a null potential is applied as the word line WLi selection signal and/or as the driving control signal Cj for all the word lines concerned by the bit lines to be pre-charged. The result of this is that the potentials applied to all the control gates 6 of the floating-gate transistors 3 are disconnected. Consequently, these transistors are, on the one hand, non-conductive and, secondly, do not get programmed during this neutralization.

While the neutralization is effective, the bit lines ending in the memory cells to be programmed are pre-charged. This pre-charging operation is performed by the application, through a series of switches such as 19, of a high programming voltage VPP given, for example, by a known type of generator. This generator may possess only very low current throughput qualities. In practice, the switches 19 may be transistors for which the control gate 20 receives a pre-charging signal PRECH which commands the connection of the programming voltage VPP to the bit lines.

In FIG. 3, the diagrams 3a to 3g respectively show the potentials attained respectively by the pre-charging signal PRECH, and its complementary signal CPRECH, VSENSE, WLi, Bi, AG and Cj. It is observed that, during the pre-charging operation, the pre-charging signal is at a high potential, namely at VPP, to make the transistors such as 19 conductive until the bit lines to which they are connected reach the programming potential VPP. During this pre-charging operation, the signals (CHEPR) for neutralizing the line bits and for the selection (WLi or Cj) of the cells are at zero. The transistors such as 17 are therefore open, and the bit lines cannot get discharged. It is furthermore observed that, during this pre-charging operation, the signals WLi are all null as is, as a precaution measure, the signal VSENSE. The signal Cj (FIG. 3g) is not taken to zero, the transistors 16 are on, but this is not important since the series-mounted transistors 15 are open. Consequently, the control gates 6 of the floating-gate transistors 3 are, all the same, disconnected. For reasons which shall be examined further below, the signal AG, applied to the mains ground connections 14 is taken to an intermediate potential (for example VPP/2) during this pre-charging operation and until the end of the programming. The result of this neutralization of the selection of the bit lines, and of this pre-charging operation is that all the bit lines concerned by a pre-charging circuit 21, containing activated transistors 17 and 19, will be taken to a potential VPP.

During the programming operation (FIG. 3), a null potential will be applied to the control gates of the memory cells 3 to be programmed. This null potential is given by the signal VSENSE which is equal to zero during the programming stage and is transmitted by the driving transistors 16 and the command monitoring transistors 15. During the programming, the signals Cj and WLi, applied respectively to the control gates of these transistors of a chosen word line 13, are taken to a high potential. Consequently, these transistors 16 and 15 are on, and the potential VSENSE, which is null, is applied to the control gates 6 of the floating-gate transistors of the memory cells. At the same time as the signals WLi and Cj are taken to VPP (or at least one of them if the other is already at VPP), the pre-charging signal PRECH and the complementary neutralizing signal CHEPR are inverted The cutting-off of the precharging signal makes the transistors with VPP supply, such as 19, off. The VPP supply is then uncoupled from the bit line. On the contrary, turning on the transistors such as 17 through the positive activation of the signal CHEPR connects the line bits such as 11 to the corresponding outputs 22 of a register 23. The register 23 contains the programming states LBi which it is necessary to impose on the memory cells corresponding to one of the word lines. For example, if the word line 13 is selected to program the transistors such as 3 of the memory cells, the other word lines such as 24 are deactivated and the signals WLi that they convey remain at zero.

There are two possibilities. Either an output corresponding to a bit line of the register 23 is carried to a positive level or else it is carried to a null potential. If it is carried to a null potential, the bit line gets discharged therein and the memory cells 3, located at the intersection of this bit line and the word line 13, are programmed at a given state (for example at a state zero, depending on the logic chosen, i.e. whether positive or negative). If, on the contrary, an output such as, for example, the output 22, is taken to a positive potential, the bit line 11 cannot be discharged in the register 23 and remains at a high level. The activation of the access transistor 9 by the word line selection signal WLo, applied to the control gate 12 of the transistor, causes the potential VPP to be applied to the drain 7 of the transistor 3. At the same time, an intermediate potential AG is applied to the drain of this floating-gate transistor 3, and its control gate 6 is carried to a null potential. All the conditions for applying a strong electrical field at the position of the starting up boss 5 are then brought together. The electrons leave the floating gate and cause a concentration of positive charges trapped in this floating gate. The diagram of FIG. 3e shows what happens to the potential imposed on the bit line depending on whether this bit line has been selected or not, i.e. depending on whether it has been intended to program one logic state or another therein.

EEPROM type memory cells cannot really be programmed in one state or another regardless of their prior state. For, to obtain accurate programming, the content of all the cells to be programmed must be erased beforehand, and then those cells which it is particularly desired to program must be programmed in the desired logic state. For the erasing operation, advantage is taken of the page mode chosen for the programming proper. The erasure is got by subjecting the control gates 6 of the floating gate transistors 3 of the memory cells to a high potential while the null potentials are applied to their drain 7 and their source 8. FIG. 3 shows this erasing operation, done before the pre-charging operation. During this erasing operation, a high potential VSENSE is applied to the control gates 6 because, at the same instant, the transistors 16 and 15 receive, at their control gates, signals Cj and WLi, respectively, also carried to VPP. The application of a null potential to the drains 7 is got by applying a high voltage CHEPR to the control gates 18 of the neutralization transistor 17. These transistors 17 are then on and short circuit the bit lines with the outputs (taken to zero) of the register 23. Furthermore, at the same instant, the signal AG applied to the mains ground connections 14 is also taken to zero. Under these conditions, the electrical charges subjected to an inverted electrical field rejoin the floating gates 4.

The register 23 preferably has a set of flip-flops such as the flip-flop 24 provided with two inverters, 25 and 26 respectively, mounted back to back. For the erasing operation, a null potential is imposed beforehand on the bit lines. This can be got, for example, by simultaneously cancelling the signals CHEPR and VPP and by keeping the signal PRECH at VCC. Or else, quite simply, the signal PRECH is fixed at zero and the bit line is discharged through the cells. Once the cancelling operation has been done, it is possible by means of the programming signals SP, to cause the selective flipping of the flip-flops for which a change in state is desired. The signals SP are, for example, selectively applied to transistors such as 28. These transistors are series-mounted in input-output connections of the memory. The signal Cj is applied to the gates 27 of these transistors 28. The flip-flops are, of course, conditioned before the programming operation.

To program a following word line, the same operations are repeated: all the memory cells connected to the following word line are erased, the same bit line as before are again pre-charged and new cells, connected to the intersection of these same bit lines and this new word line, are programmed. Continuing in this way, the programming can be undertaken word line by word line. With the invention, there is a gain in programming time observed, as compared with the above-mentioned prior art. It may be that it is not necessary or not desired to program all the words controlled by one and the same word line. For example, assuming that there is a word line controlling 32 cells and that one logic word (used by a microprocessor) has eight bits, if it is desired to program only one of these words, it suffices to select a signal Cj corresponding to this word which is common to all eight cells. The other signals Cj remain at zero. Thus, the erasure of only eight chosen cells is got. For the programming, it is enough to put zero in the flip-flops which are attached to the bit lines controlling the cells that are not to be programmed. FIG. 2 partly shows, in the extension of the word line 13, another memory block 29 receiving the signal Cl to validate the selection of another word in series with this word line. The access to the cells of this other word can be got by duplicating the outputs (this duplication being shown by the arrows 30) of the pre-charging circuit 21.

What is claimed is:

1. A method for programming cells of a memory, said cells comprising floating gate transistors programmable by electrical field effect, wherein said method comprises:

selecting the cells to be programmed, and then, programming the selected cells by the application of programming potentials, wherein said application of programming potentials comprises:

application first of a neutralization signal to the selected cells while precharging said selected cells by applying first programing potential to said selected cells, then stopping said neutralization signal and programming said cells by applying second programming potentials to said selected cells.

2. A method according to claim 1 wherein a selection is made of cells connected to the same word line.

3. A method according to claim 2 wherein the selection is made by opening selection switches, placed in series within bit lines ending at the cells connected to said word line.

4. A method according to claim 3, wherein the neutralization signal is stopped while applying a precharged first programming potential (PRECH) while closing said selection switches.

5. A method according to claim 3 wherein said precharging first programming potential is a high potential applied to the bit line.

6. A method according to any of the claims 2 or 3 wherein said precharging first programming potential is a low potential applied to the word line.

7. A method according to claim 6 wherein several cells belonging to the same word line are erased at the same time before said cells are programmed.

8. A method according to any of the claims 1, or 2, or 3 wherein said precharging first programming potential is an intermediate potential applied to a ground connection of the cell.

* * * * *